United States Patent [19]

Okaniwa

[11] Patent Number: 5,438,212
[45] Date of Patent: Aug. 1, 1995

[54] SEMICONDUCTOR DEVICE WITH HEAT DISSIPATION STRUCTURE

[75] Inventor: Kazuhiro Okaniwa, Itami, Japan

[73] Assignee: Mitsubishi Denki Kabushiki Kaisha, Tokyo, Japan

[21] Appl. No.: 201,224

[22] Filed: Feb. 24, 1994

[30] Foreign Application Priority Data

Feb. 25, 1993 [JP] Japan .................. 5-035916
Aug. 23, 1993 [JP] Japan .................. 5-207425

[51] Int. Cl.$^6$ .................. H01L 29/40; H01L 29/58; H01L 29/784
[52] U.S. Cl. .................. 257/275; 257/276; 257/621
[58] Field of Search .............. 257/275, 276, 277, 621, 257/728, 773, 774

[56] References Cited

U.S. PATENT DOCUMENTS 3,969,745  7/1976  Blocker, III .................. 257/276

FOREIGN PATENT DOCUMENTS 61-23350   1/1986  Japan .
63-155773  6/1988  Japan .................. 257/276
63-198377  8/1988  Japan .
4311069    11/1992 Japan .

Primary Examiner—Robert P. Limanek
Assistant Examiner—Wael M. Fahmy
Attorney, Agent, or Firm—Leydig, Voit & Mayer

[57] ABSTRACT

A semiconductor device includes a heat generating element disposed on a front surface of a semiconductor substrate and a cavity disposed within the semiconductor substrate opposite the heat generating element. In this structure, heat generated by the heat generating element is conducted through the substrate to the cavity, whereby the thermal conductivity of the device is improved. In a method for producing the semiconductor device, portions of the substrate at opposite sides of the heat generating element are selectively etched in a direction perpendicular to the front surface to form first holes (first etching process). Thereafter, the substrate is selectively etched from the front surface to form second holes beneath the respective first holes (second etching process). During the second etching process, the second holes are connected to each other, resulting in the cavity for heat radiation.

9 Claims, 14 Drawing Sheets

SEMICONDUCTOR DEVICE WITH HEAT DISSIPATION STRUCTURE

FIELD OF THE INVENTION

The present invention relates to semiconductor devices and, more particularly, to a microwave monolithic integrated circuit (hereinafter referred to as MMIC) including high frequency field effect transistors (hereinafter referred to as FETs) comprising compound semiconductors, such as GaAs. The invention also relates to a method for fabricating such semiconductor devices.

BACKGROUND OF THE INVENTION

FIG. 19 is a sectional view illustrating a part of a conventional MMIC including high frequency FETs. In FIG. 19, reference numeral 1 designates a semiconductor substrate having opposite front and rear surfaces. Usually, a GaAs substrate is used for high frequency FETs. Two FETs with a common drain electrode are disposed on the front surface of the substrate 1. More specifically, a common drain electrode 2 comprising AuGe/Ni/Au is disposed on a prescribed part of the front surface of the substrate 1. Two gate electrodes 3 comprising Ti/Al are disposed on the substrate 1 at opposite sides of the drain electrode 2. Two source electrodes 6 comprising AuGe/Ni/Au are disposed on the substrate 1 at opposite sides of the gate electrodes 3. A via-hole 9 penetrates through the substrate 1, and a grounding electrode 10 comprising Ni/Au is disposed over the rear surface of the substrate 1 and the internal surface of the via-hole 9. An electrode 7 comprising Ti/Au or Ti/Al is disposed on the front surface of the substrate 1 opposite the via-hole 9. Hereinafter, this electrode 7 on the via-hole 9 is referred to as upper electrode. A microstrip line 8 comprising Ti/Au connects the source electrode 6 to the upper electrode 7. An active region (not shown) is disposed within the substrate 1 reaching the front surface.

FIGS. 20(a)–20(c) illustrate process steps for fabricating the structure of FIG. 19.

Initially, the source electrodes 6 and the drain electrode 2 are formed on the front surface of the substrate 1 by vapor-deposition and lift-off techniques. Then, the gate electrodes 3 are formed by vapor-deposition and lift-off. After producing passivation films, resistors, inductors, and capacitors (these elements are not shown), the microstrip line 8 is formed by vapor-deposition and lift-off. Thereafter, the upper electrode 7 is formed by vapor-deposition and lift-off, and plating (FIG. 20(a)).

In the step of FIG. 20(b), the rear surface of the substrate 1 is ground to reduce the thickness of the substrate to 100~200 μm. Other techniques, such as lapping, polishing, or etching, may be employed in place of grinding. Thereafter, a portion of the substrate 1 directly under the upper electrode 7 is etched away from the rear surface, forming the via-hole 9 penetrating through the substrate.

In the step of FIG. 20(c), Ni/Au is plated over the rear surface of the substrate 1 including the internal surface of the via-hole 9 by electroless plating, followed by electroplating of Au over the rear surface, whereby the grounding electrode 10 is formed in electrical contact with the upper electrode 7.

In the conventional high frequency MMIC, since the substrate 1 is 100~200 μm thick, when the substrate 1 comprises GaAs having a thermal conductivity of 46 W/m.K, radiation of heat generated by the FETs is poor, whereby the temperature in a region in the vicinity of the gate electrode is unfavorably increased, adversely affecting the high-frequency characteristics and reliability of the device. If the thickness of the substrate 1 is reduced to about 30 μm to improve the heat radiation, the mechanical strength of the IC chip is reduced, resulting in difficulty in handling the IC chip.

Japanese Published Patent Applications Nos. 61-23350, 63-19877, and 4-311069 disclose a semiconductor device in which a heat generating element is disposed on a semiconductor substrate, and an opening is formed from the rear surface of the substrate opposite the heat generating element and filled with a metal, whereby heat radiation in the vicinity of the heat generating element is improved.

However, when a via-hole for connecting an electrode on the front surface of the substrate to an electrode on the rear surface of the substrate is formed in the substrate including the opening for heat radiation, the via-hole and the opening are usually formed in different etching steps using different etching masks. In this case, the member of process steps is increased and the mask alignment is complicated due to fine wirings, resulting in a reduction in production precision.

SUMMARY OF THE INVENTION

An object of the present invention is to provide a highly-reliable semiconductor device with improved high-frequency characteristics with improved radiation of heat generated by a heat generating element disposed on a substrate while maintaining a thickness of the substrate in a range of 100~200 μm.

Another object of the present invention is to provide a relatively simple method for producing such semiconductor devices with high precision.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor device includes a heat generating element disposed on a front surface of a semiconductor substrate and a cavity disposed within the semiconductor substrate opposite the heat generating element. Therefore, heat generated by the heat generating element is transmitted through the substrate to the cavity, whereby the thermal conductivity is improved.

According to a second aspect of the present invention, a film having a high thermal conductivity, such as a metal film, is disposed over the internal surface of the cavity. Alternatively, the cavity is filled with a material having a high thermal conductivity. Therefore, the thermal conductivity of the device is significantly improved.

According to a third aspect of the present invention, the cavity having a metal film on the internal surface or the cavity filled with a metal is connected to a grounding electrode on the rear surface of the substrate by a hole filled with a metal or has a metal film on the internal surface, which metal or metal film connects the metal or metal film in the cavity to the rear surface of the substrate. In this case, the cavity for heat radiation also serves as a via-hole.

According to a fourth aspect of the present invention, in a method for producing the above-described semiconductor device including the cavity for heat radiation, portions of the substrate at opposite sides of the heat generating element are selectively etched in a direction perpendicular to the front surface to form first holes (first etching process). Thereafter, the substrate is selectively etched from the front surface to form second holes beneath the respective first holes (second etching process). During the second etching process, the second holes are connected to each other, resulting in a cavity.

According to a fifth aspect of the present invention, in the above-described production method, an etch stopping layer which is not etched by a first etchant is formed on the front surface of the substrate, the first holes are formed using a second etchant which etches the etch stopping layer, and the second holes are formed using the first etchant. Therefore, the dimension of the second hole are precisely controlled.

According to a sixth aspect of the present invention, in a method for producing a semiconductor device, a semiconductor substrate having a heat generating element on the front surface is wet-etched or dry-etched from the rear surface using an etching mask having a first aperture opposite a region where a via-hole is to be formed and a plurality of second apertures opposite the heat generating element, each second aperture being smaller than the first aperture, whereby a via-hole and a hole for heat radiation are produced simultaneously. Therefore, the time required for the etching process is significantly reduced. In addition, the thickness of the substrate remaining above the hole for heat radiation is easily controlled.

According to a seventh aspect of the present invention, in a method for producing a semiconductor device, a semiconductor substrate having a heat generating element on the front surface is selectively dry-etched from the rear surface to form a hole having a first depth in a region where a via-hole is to be formed. Thereafter, the semiconductor substrate is wet-etched from the rear surface using an etching mask having a first aperture pattern opposite the region where a via-hole is to be formed and a second aperture opposite the heat generating element, whereby a via-hole penetrating through a prescribed part of the substrate and a hole for heat radiation having a second depth are produced at the same time. Therefore, the time required for the etching process is significantly reduced. In addition, the thickness of the substrate remaining above the hole for heat radiation is easily controlled.

According to an eighth aspect of the present invention, in a method for producing a semiconductor device, a semiconductor substrate having a heat generating element on the front surface is selectively wet-etched from the rear surface to form a hole having a third depth in a region where a via-hole is to be formed. Thereafter, the substrate is selectively dry-etched from the rear surface using an etching mask having a first aperture opposite the region where a via-hole is to be formed and a second aperture opposite the heat generating element, whereby a via-hole penetrating through a prescribed part of the substrate and a hole for heat radiation having a fourth depth are produced simultaneously. Therefore, the time required for the etching process is significantly reduced. In addition, the thickness of the substrate remaining above the hole for heat radiation is easily controlled.

DETAILED DESCRIPTION OF THE PREFERRED EMBODIMENTS

Figure 1:
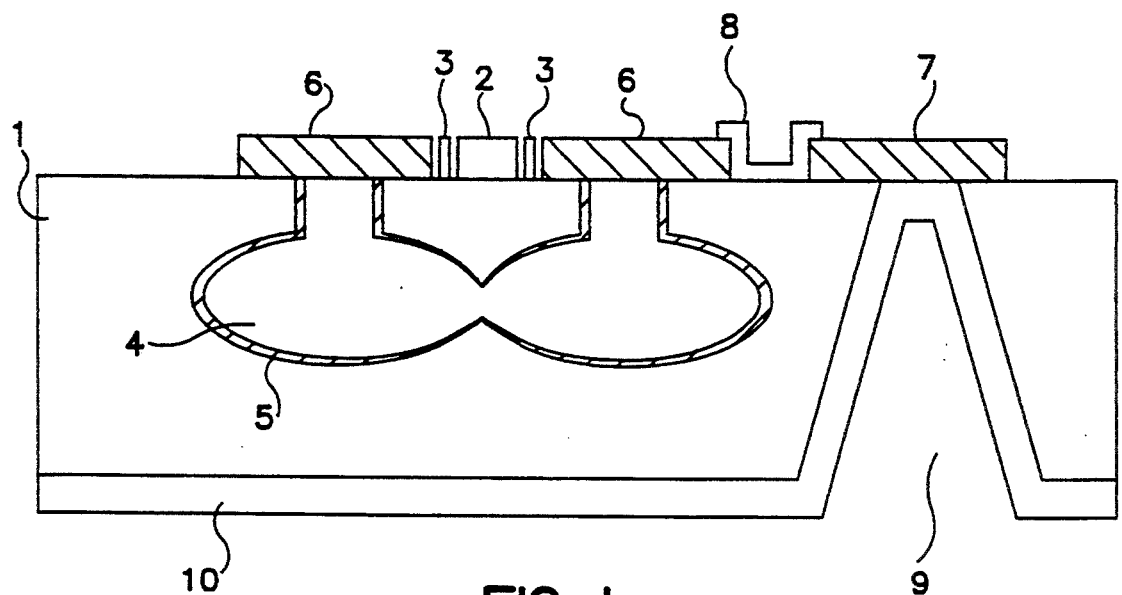
FIG. 1 is a sectional view illustrating a part of a high frequency MMIC in accordance with a first embodiment of the present invention.
Figure 19:
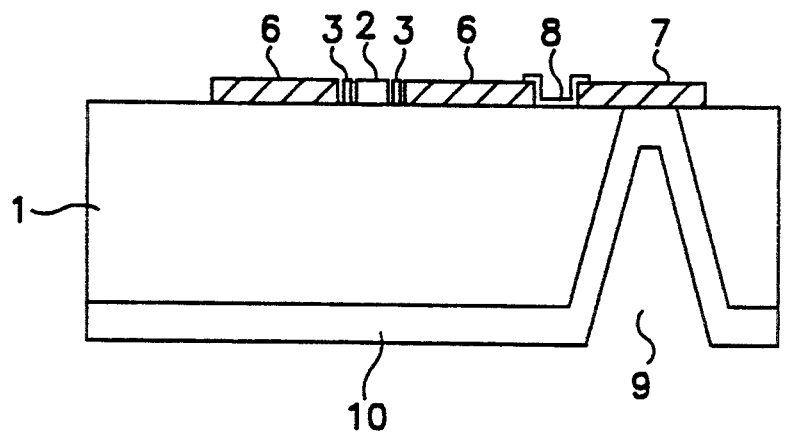
FIG. 19 is a sectional view illustrating a part of a high frequency MMIC in accordance with the prior art.
Figure 20A:
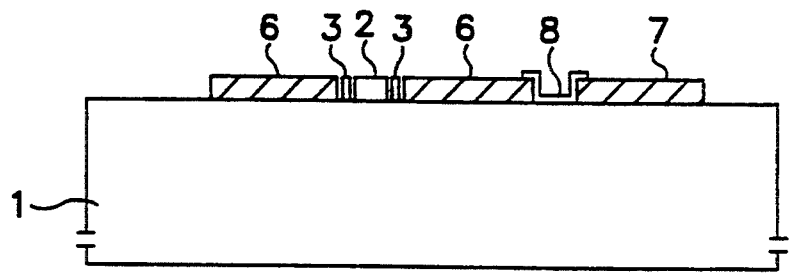
FIGS. 20(a)–20(c) are sectional views illustrating process steps in a method for producing the structure of FIG. 19.
Figure 20B:
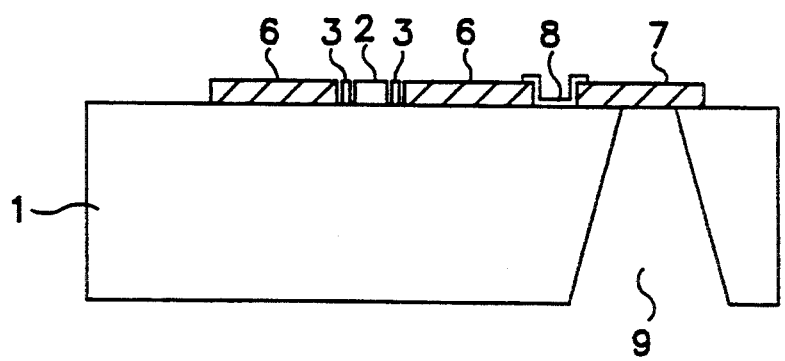
Figure 20C:
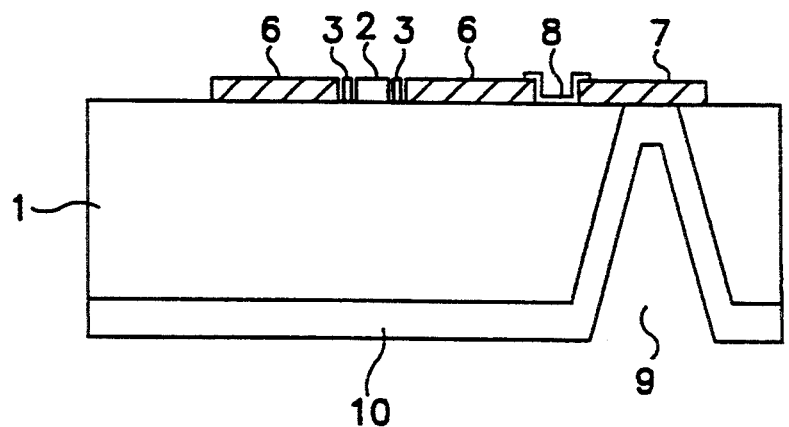

FIG. 1 is a sectional view illustrating a part of a high frequency MMIC in accordance with a first embodiment of the present invention. In FIG. 1, the same reference numerals as in FIG. 19 designate the same or corresponding parts. A cavity 4 is disposed in the GaAs substrate 1 opposite the FETs. The internal surface of the cavity 4 is covered with a metal film 5. An active region (not shown) is disposed within the GaAs substrate 1 reaching the front surface.

FIGS. 2(a)-2(e) are sectional views illustrating process steps in a method for fabricating the structure of FIG. 1.

Figure 2A:
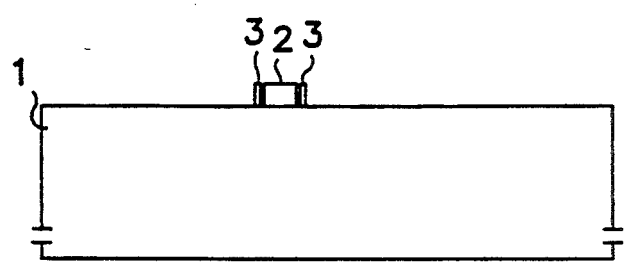
FIGS. 2(a)–(e) are sectional views illustrating process steps in a method for producing the structure of FIG. 1.

Initially, a common drain electrode 2 is formed on the front surface of the GaAs substrate 1 using vapor-deposition and lift-off techniques and, thereafter, gate electrodes 3 are formed on the substrate 1 at opposite sides of the drain electrode 2 by vapor-deposition and lift-off techniques (FIG. 2(a)).

Figure 2B:
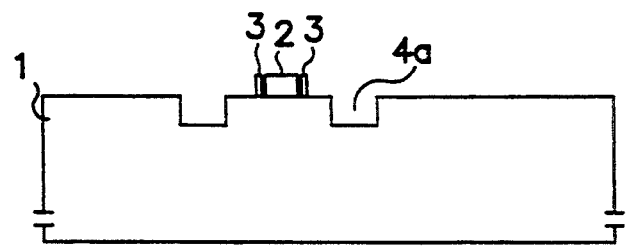

In the step of FIG. 2(b), two holes 4a having vertical side walls (hereinafter referred to as first holes) are formed in the GaAs substrate 1 at positions where source electrodes are to be formed. These first holes 4a are formed by dry etching using a photoresist mask (not shown). More specifically, the dry etching is carried out with a gas mixture of $Cl_2$ (chlorine) and $SiCl_4$ (silicon tetrachloride) ($Cl_2:SiCl_4=1:4$) which provides corrosion and sedimentation, at a pressure of 30 mTorr, for ten minutes (first etching process). The depth of the first hole 4a is about 10 μm.

Figure 2C:
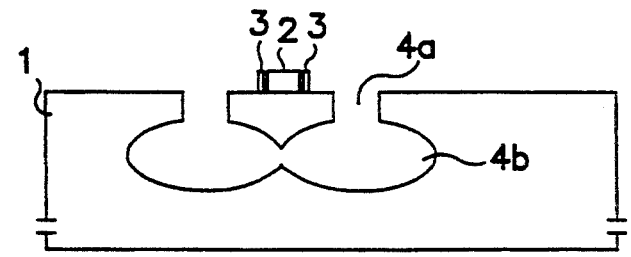

In the step of FIG. 2(c), using the above-described photoresist mask, the substrate is dry-etched with a gas mixture of $Cl_2$ and $SiCl_4$ (=1:1) which provides only corrosion, at a pressure of 60 mTorr, for thirty minutes (second etching process). During the second etching process, second holes 4b about 50 μm deep are formed under the respective first holes 4a, and these second holes 4b are connected to each other. Since the vertical side walls of the first holes 4a are covered with a reaction product comprising Si, C, Cl, and O, these side walls are not etched in the second etching process.

Figure 2D:
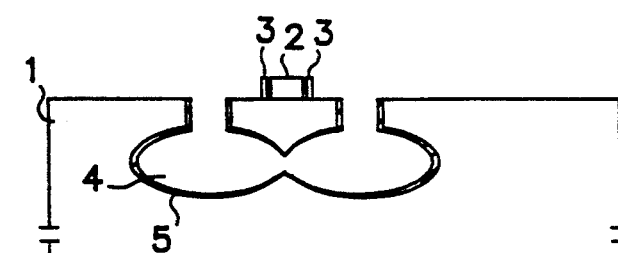

Thereafter, using the above-described photoresist mask, Au or Ni is plated on the internal surfaces of the holes 4a and 4b by electroless plating (FIG. 2(d)).

Figure 2E:
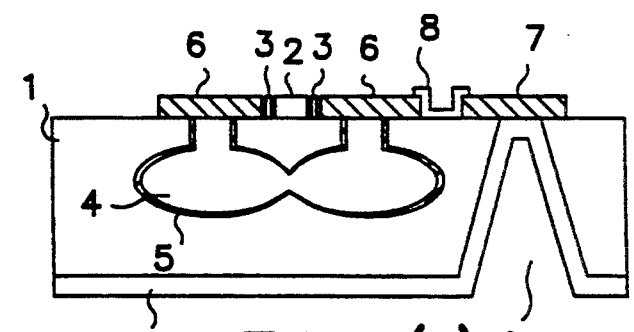

In the step of FIG. 2(e), source electrodes 6 are formed on the substrate 1 covering the first holes 4a by vapor-deposition and lift-off techniques, followed by production of passivation films, resistors, inductors, and capacitors (these elements are not shown). Although the spaced apart source electrodes 6 are connected to each other by the metal film 5 in the cavity 4, there are some cases where the metal film 5 is not in contact with the source electrodes 6 according to the purpose of the device.

After forming a microstrip line 8 by vapor-deposition and lift-off, an electrode 7 is formed on a prescribed region of the substrate 1 using vapor deposition and lift-off and plating techniques. Then, the substrate 1 is ground from the rear surface to reduce the thickness to 100~200 μm. Other techniques, such as lapping, polishing, or etching, may be employed in place of grinding. Then, a portion of the substrate 1 opposite the electrode 7 is selectively etched away to form a via-hole 9 penetrating through the substrate 1. Finally, Ni/Au is plated over the rear surface of the substrate 1 including the internal surface of the via-hole 9 by electroless plating, followed by electroplating of Au, whereby a grounding electrode 10 is formed in electrical contact with the electrode 7.

According to the first embodiment of the present invention, since the cavity 4 is disposed in the GaAs substrate 1 opposite the FETs, heat generated in the vicinity of the gate electrodes 3 of the FETs is conducted through the active region to the cavity 4. Therefore, the heat radiating region is increased, whereby the heat conductivity is improved. As a result, the high-frequency characteristics and reliability of the device are improved while maintaining the thickness of the substrate. Since the internal surface of the cavity 4 is covered with the plated Au film 5 having a relatively high heat conductivity of 319 W/m.K, the heat conductivity is significantly improved.

Figure 3:
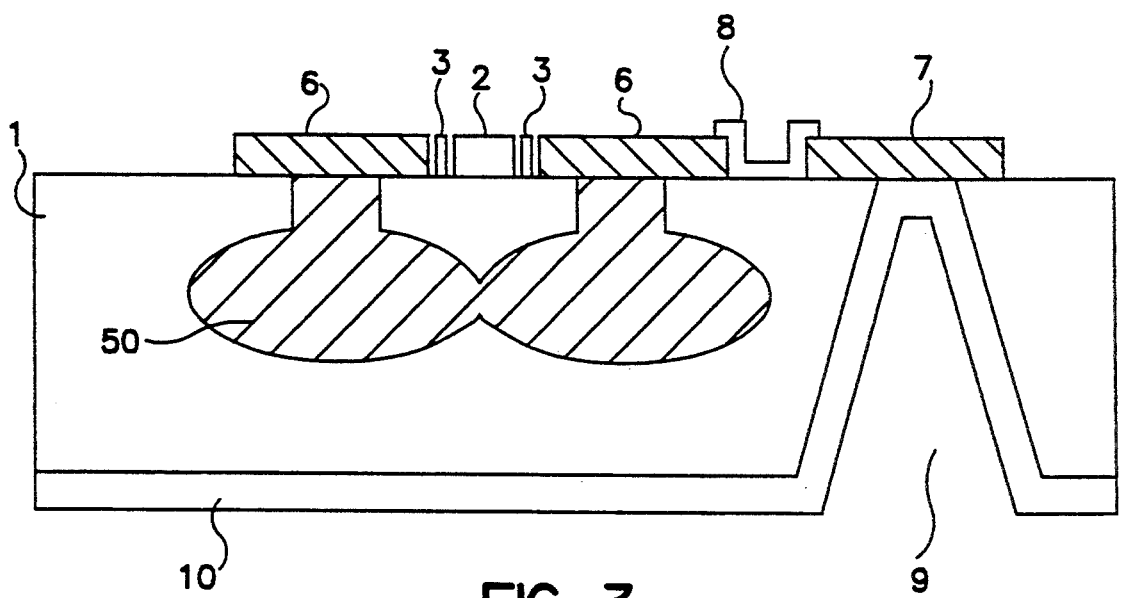
FIG. 3 is a sectional view illustrating a part of a high frequency MMIC in accordance with a second embodiment of the present invention.

FIG. 3 is a sectional view illustrating a part of a high frequency MMIC according to a second embodiment of the present invention. The structure shown in FIG. 3 is identical to the structure of FIG. 1 except that the cavity 4 is filled with a metal 50.

Figure 4A:
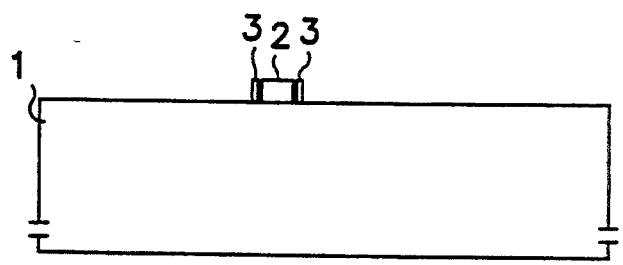
FIGS. 4(a)–4(e) are sectional views illustrating process step in a method for producing the structure of FIG. 3.
Figure 4B:
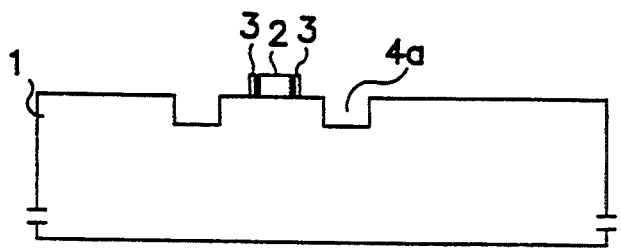
Figure 4C:
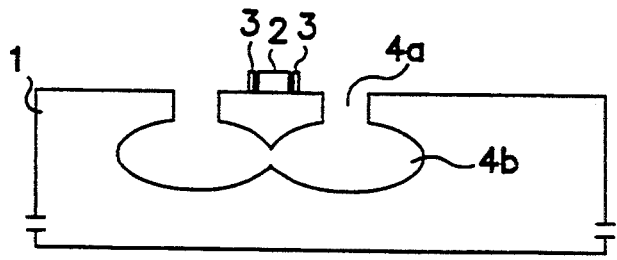

A method for fabricating the structure of FIG. 3 is illustrated in FIGS. 4(a)-4(e). The steps illustrated in FIGS. 4(a)-4(c) are identical to those already described with respect to FIGS. 2(a)-2(c) and, therefore, do not require repeated description.

Figure 4D:
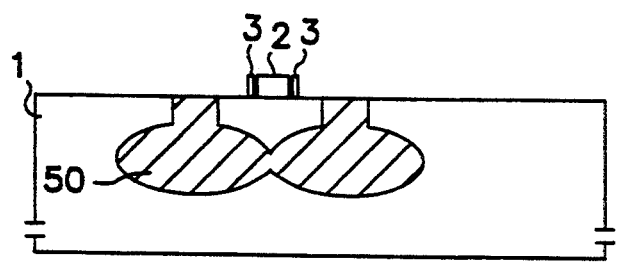

In the step of FIG. 4(d), the cavity 4 is filled with a metal 50, such as Ni or Au, by electroless plating or pulse electroplating.

Figure 4E:
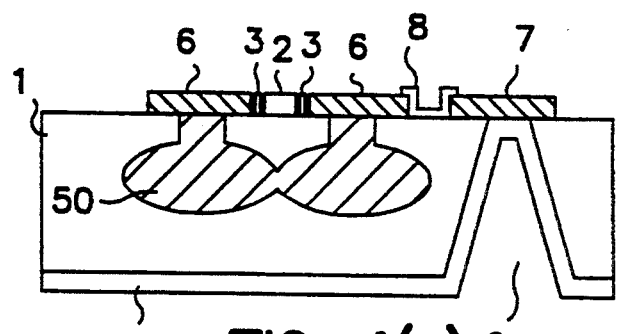

After the formation of the metal 50 in the cavity 4, the device is completed as shown in FIG. 4(e) through the same process steps as already described with respect to FIG. 2(e).

In this second embodiment of the present invention, since the cavity 4 is filled with the metal 50, the radiation of heat generated in the vicinity of the gate electrodes 3 is further improved. In addition, an unwanted reduction in the strength of the substrate 1 due to the cavity 4 is avoided. It is desired that the thermal expansion coefficient of the metal 50 be equivalent to that of the substrate 1.

Figure 5:
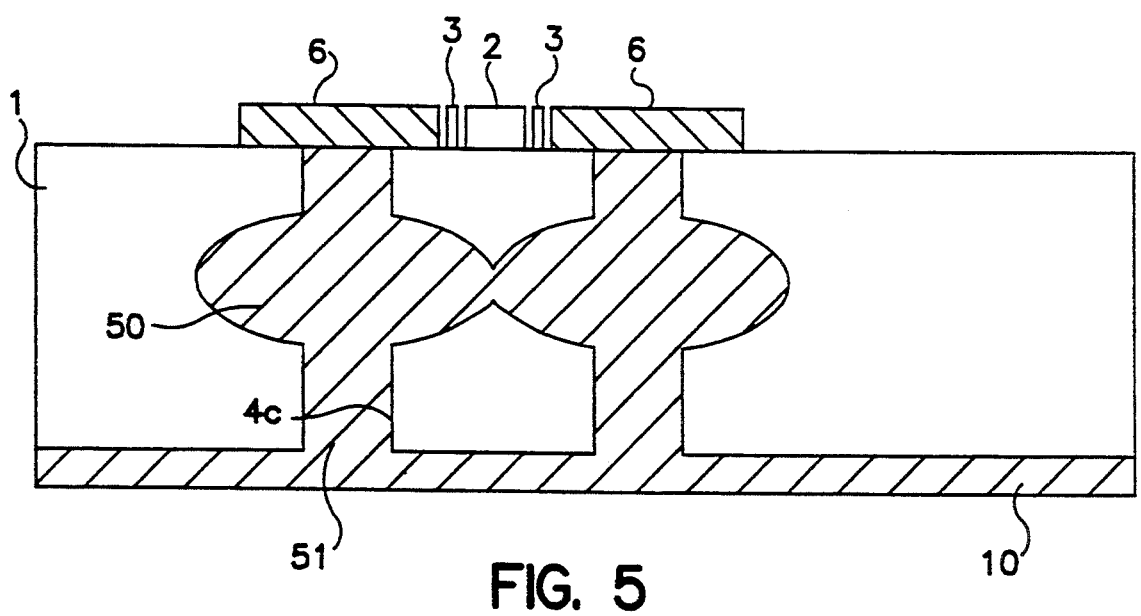
FIG. 5 is a sectional view illustrating a part of a high frequency MMIC in accordance with a third embodiment of the present invention.

FIG. 5 is a sectional view illustrating a part of a high frequency MMIC in accordance with a third embodiment of the present invention. In this third embodiment, the metal 50 filling the cavity 4 and contacting the source electrodes 6 is connected to the grounding electrode 10 on the rear surface of the substrate 1 via third holes 4c filled with a metal 51, whereby the source electrodes 6 are electrically connected to the grounding electrode 10.

FIGS. 6(a)-6(f) illustrate process steps for fabricating the structure of FIG. 5. The steps illustrated in FIGS. 6(a)-6(d) are identical to those already described with respect to FIGS. 4(a)-4(d) and, therefore, do not require repeated description.

Figure 6A:
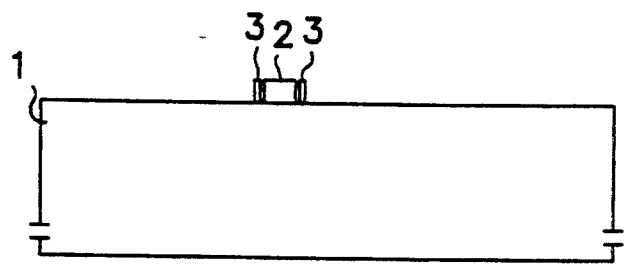
FIGS. 6(a)–6(f) are sectional views illustrating process steps in a method for producing the structure of FIG. 5.
Figure 6B:
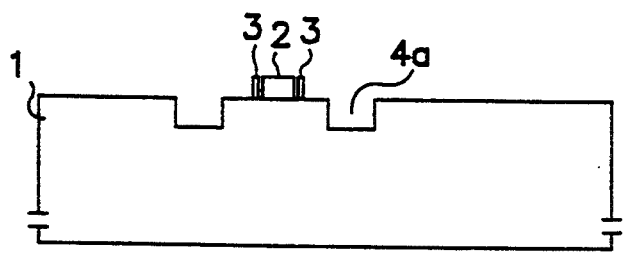
Figure 6C:
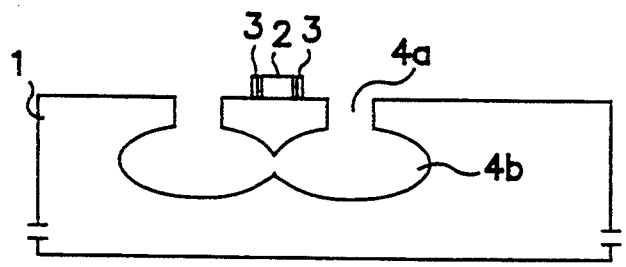
Figure 6D:
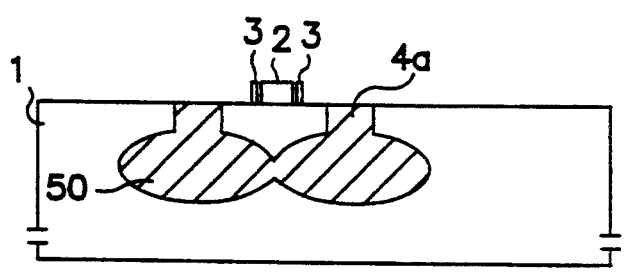
Figure 6E:
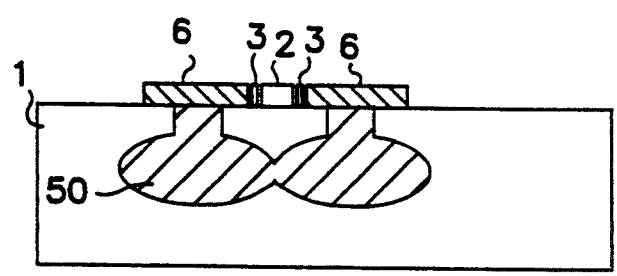

After formation of the source electrodes 6, the thickness of the substrate 1 is reduced to 100-200 μm (FIG. 6(e)). In this step, the via-hole and the electrode above the via-hole are not produced.

Figure 6F:
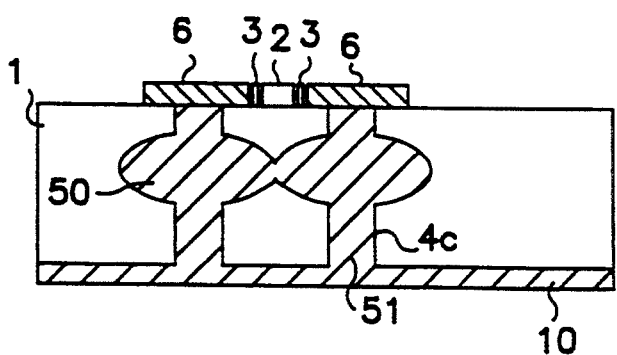

In the step of FIG. 6(f), the rear surface of the substrate 1 is selectively dry-etched using a photoresist pattern (not shown) as a mask until the etching front reaches the metal 50, forming third holes 4c. After removal of the photoresist pattern, Ni/Au 51 is plated on the rear surface of the substrate 1 by electroless plating, followed by electroplating of Au, whereby the third holes 4c are filled with the metal 51 and the grounding electrode 10 is produced.

In this structure, the cavity 4 filled with the metal 50 for heat radiation also serves as a via-hole for grounding the source electrodes 6, whereby the size of the device is reduced.

It is desired that the third hole 4c be smaller than the second hole 4b. In place of forming the third holes 4c, second holes 4b reaching the rear surface of the substrate 1 may be formed in the step of FIG. 6(c). Also in this case, the same effects as described above are achieved.

While in the above-described third embodiment the metal 50 filling in the cavity 4 is connected to the grounding electrode 10, in the structure of the first embodiment shown in FIG. 1, the metal film 5 covering the internal surface of the cavity 4 may be connected to the grounding electrode 10.

Figure 7:
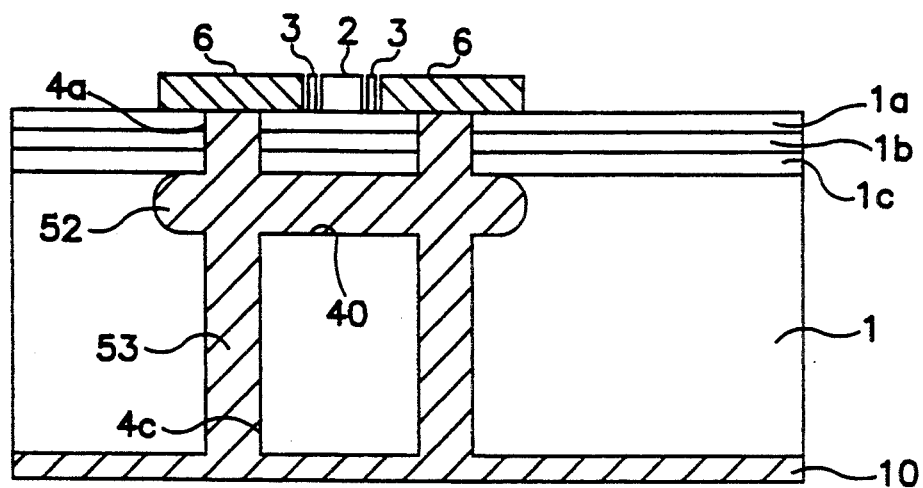
FIG. 7 is a sectional view illustrating a part of a high frequency MMIC in accordance with a fourth embodiment of the present invention.

FIG. 7 is a sectional view illustrating a part of a high-frequency MMIC in accordance with a fourth embodiment of the present invention. In this fourth embodiment, a GaAs substrate 1 on which an i type AlGaAs layer 1c, a buffer layer 1b, and an n type GaAs layer 1a are successively disposed is employed as a substrate of the MMIC, whereby the dimension of the cavity formed in the substrate is precisely controlled.

A description is given of the production process.

Initially, the GaAs substrate 1 on which the i type AlGaAs layer 1c, the buffer layer 1b, and the n type GaAs layer 1a are successively disposed is selectively etched from the surface of the n type GaAs layer 1a using a gas mixture of $Cl_2$ and $SiCl_4$ (=1:4) at a pressure of 30 mTorr (first etching process), forming first holes 4a vertically penetrating through these layers 1a to 1c. Thereafter, the substrate is further etched using a gas mixture of $Cl_2$, $SiCl_4$, and $SF_6$ (sulfur hexafluoride) (=1:4:1), at a pressure of 60 mTorr, for thirty minutes (second etching process). During the second etching process, a second hole which is long from side to side and about 50 $\mu$m deep is formed directly under each of the first holes 4a, and these second holes are connected to each other, resulting in a cavity 40. Since the n type AlGaAs layer 1c is passivated by the $SF_6$ gas, it is not etched. That is, the n type AlGaAs layer 1c serves as an etching stopper when the cavity 40 is formed in the second etching process, whereby the dimension of the cavity 40 is easily controlled. Since the vertical side walls of the first holes 4a are covered with a reaction product comprising Si, C, Cl, and O, these side walls are not etched in the second etching process. Thereafter, the first holes 4a and the cavity 40 are filled with a metal 52, and third holes 4c are formed and filled with a metal 53 using the same process as already described with respect to FIG. 6(f).

While in the above-described first to fourth embodiments the internal surface of the cavity is covered with metal or the cavity is filled with metal, other materials having good heat conductivity, such as a conductive resin, may be employed in place of metal.

Figure 8:
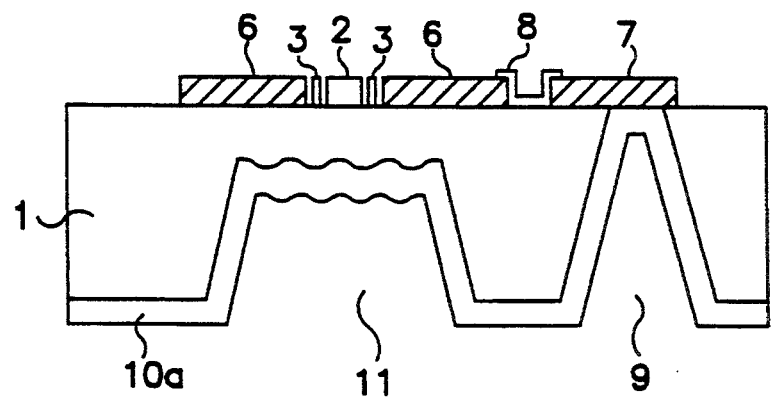
FIG. 8 is a sectional view illustrating a part of a high frequency MMIC in accordance with a fifth embodiment of the present invention.

FIG. 8 is a sectional view illustrating a part of a high frequency MMIC in accordance with a fifth embodiment of the present invention. In FIG. 8, a hole 11 having a corrugated bottom surface is formed in the substrate 1 opposite the FET.

A method for fabricating the structure of FIG. 8 is illustrated in FIGS. 9(a)-9(d).

Figure 9A:
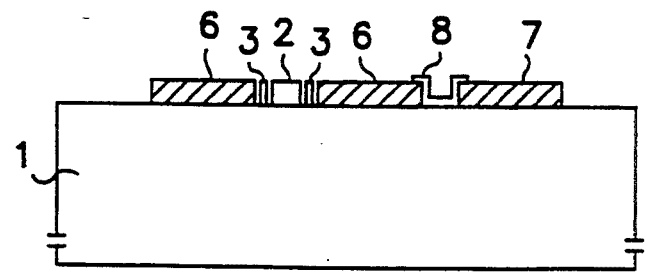
FIGS. 9(a)–9(d) are sectional views illustrating process steps in a method for producing the structure of FIG. 8.
Figure 9B:
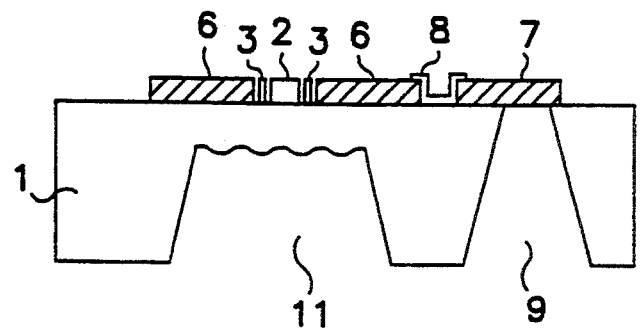
Figure 10:
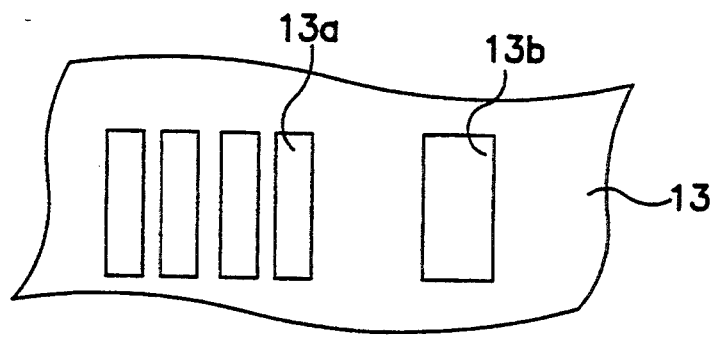
FIG. 10 is a plan view of an etching mask employed in the production method of FIGS. 9(a)–9(d).
Figure 11:
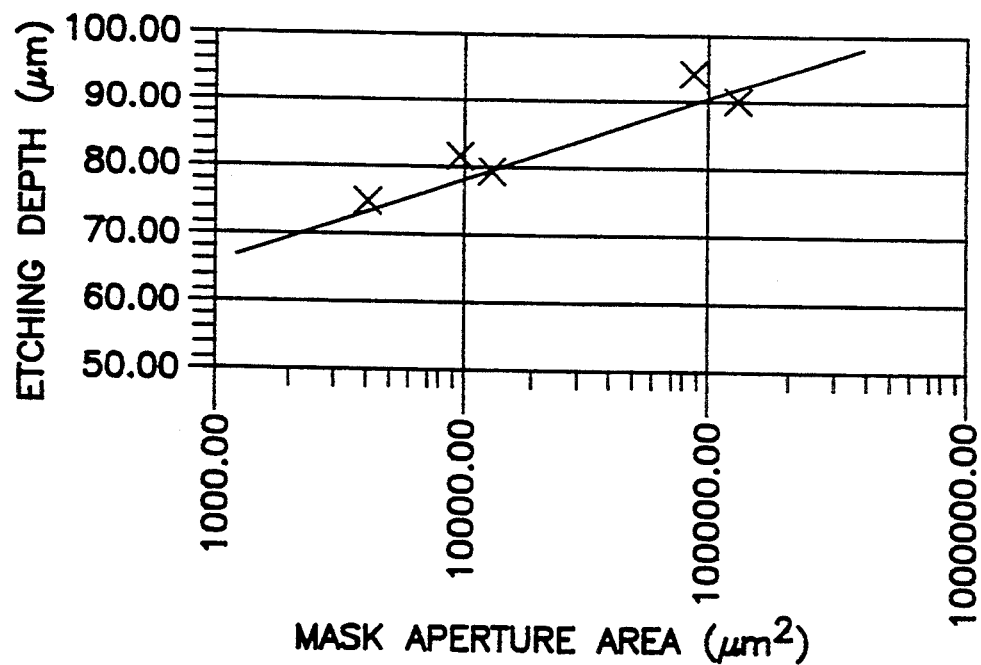
FIG. 11 is a graph for explaining a dependence of etching rate on etching mask aperture area in wet etching.

Initially, as illustrated in FIG. 9(a), the common drain electrode 2, the gate electrodes 3, the source electrodes 6, and the electrode 7 are formed on the front surface of the GaAs substrate 1, followed by grinding of the rear surface of the substrate 1 to reduce the thickness of the substrate. Thereafter, the rear surface of the substrate 1 is selectively etched using a mask 13 having a plurality of small apertures 13a and a large aperture 13b as shown in FIG. 10. The area of the large aperture 13b must be more than ten times as large as the aperture 13a. In this embodiment, the area of the small aperture 13a is 50 $\mu$m $\times$ 10 $\mu$m while the area of the large aperture 13b is 100 $\mu$m $\times$ 50 $\mu$m. The interval between the adjacent small apertures 13a is about 30 $\mu$m. FIG. 11 illustrates the dependence of the etching rate on the mask aperture area in a wet etching using $H_2SO_4$: $H_2O_2$:$H_2O$ (=100 cc:500cc:100cc) as an etchant. As shown in FIG. 11, the ten-fold increase in the mask aperture area results in an increase in the etching depth by 20~30 $\mu$m. Therefore, if the etching of the hole 9 through the large aperture 13b is stopped when the hole 9 penetrates through the substrate 1, the etching of the hole 11 through the small apertures 13a is stopped leaving a portion of the substrate 1 having a thickness of 20~30 $\mu$m (FIG. 9(b)). The etching time depends on the thickness of the substrate. For example, when the thickness of the substrate is 100 $\mu$m, 150 $\mu$m, or 200 $\mu$m, the etching is carried out for 30~40 minutes, 90~120 minutes, 120~150 minutes, respectively.

Since the $H_2SO_4$ system wet etching is employed, side etching occurs at a ratio of 0.6~1.0 to the etching in the depth direction. The interval between adjacent small apertures 13a is 30 $\mu$m. Therefore, during wet etching, a plurality of holes are formed opposite the respective apertures 13a, and these holes are connected to each other due to the side-etching, resulting in the large hole 11. Although the hole 11 has a corrugated bottom surface, it does not adversely affect the heat radiation of the FETs on the front surface of the substrate 1.

Figure 9C:
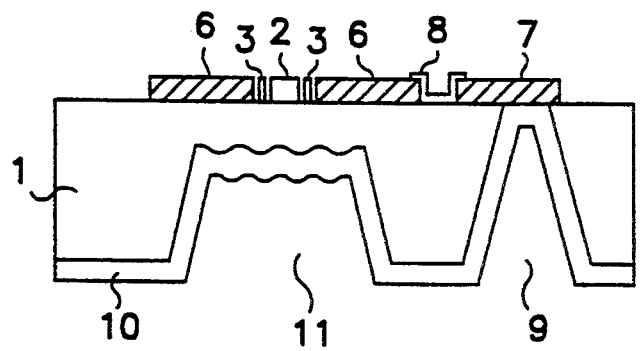
Figure 9D:
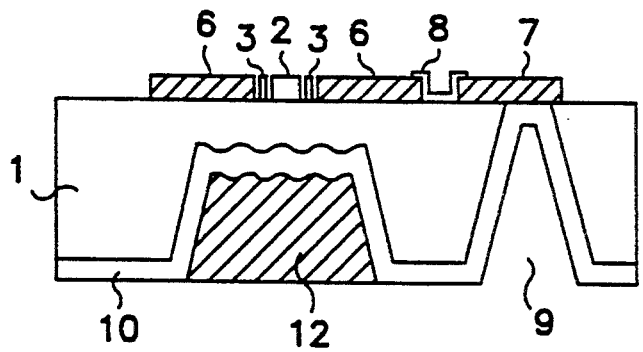

In the step of FIG. 9(c), a grounding electrode 10 is formed over the rear surface of the substrate 1 including the internal surfaces of the hole 11 and the via-hole 9. The hole 11 may be filled with a plated Au layer 12 as shown in FIG. 9(d). In this case, heat generated by the FETs on the front surface of the substrate is rapidly conducted to the rear surface of the substrate, whereby output efficiency and reliability are further improved.

In this fifth embodiment of the present invention, since the hole 11 for heat radiation and the via-hole 9 are formed simultaneously by wet etching using the etching mask 13 shown in FIG. 10, the production process is simplified. In addition, since the hole 11 and the via-hole 9 are formed using the same mask 13, complicated mask alignment is dispensed with. As a result, production precision is significantly improved.

While in the above-described fifth embodiment the hole 11 is filled with the plated Au layer 12, it may be filled with AuSn solder that is used for die-bonding of the IC chip. In this case, the amount of the AuSn solder for die-bonding is increased so that the AuSn solder enters in the hole 11 in the die-bonding process.

Figure 12:
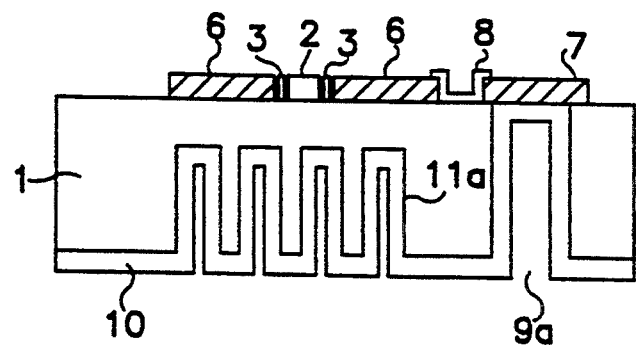
FIG. 12 is a sectional view illustrating a high frequency MMIC in accordance with a sixth embodiment of the present invention.

FIG. 12 is a sectional view illustrating a part of a high frequency MMIC according to a sixth embodiment of the present invention. In FIG. 12, a vertical via-hole 9a penetrates through the substrate 1, and a plurality of vertical holes 11a are formed in the substrate 1 opposite the FETs.

A description is given of the production process.

Figure 13A:
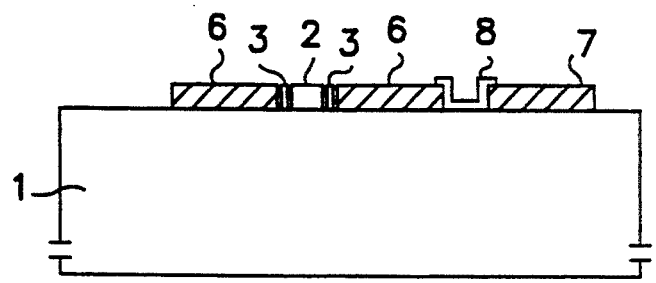
FIGS. 13(a)–13(c) are sectional views illustrating process steps in a method for producing the structure of FIG. 12.
Figure 13B:
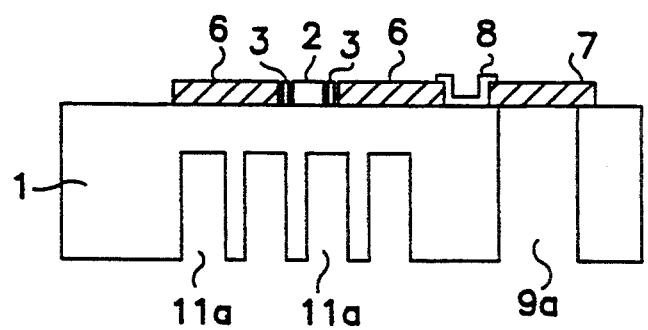
Figure 14:
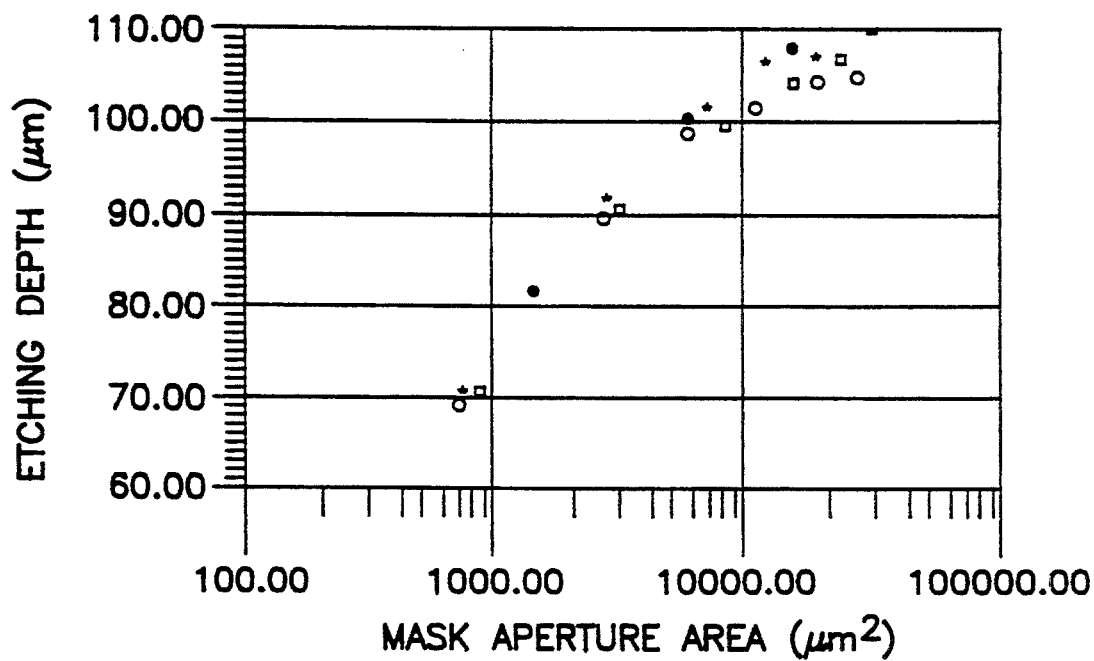
FIG. 14 is a graph for explaining a dependence of etching rate on etching mask aperture area in dry etching.

Initially, a GaAs substrate 1 shown in FIG. 13(a) is dry-etched from the rear surface using an etching mask having aperture patterns as shown in FIG. 10. In this sixth embodiment, the area of the small aperture 13a is 70 $\mu$m $\times$ 10 $\mu$m, and the area of the large aperture 13b is 100 $\mu$m $\times$ 70 $\mu$m. The interval between the adjacent small apertures 13a is about 5 $\mu$m. FIG. 14 illustrates a dependence of the etching rate on the mask aperture area in a dry etching process using $SiCl_4$/$Cl_2$ gas. As shown in FIG. 14, a ten-fold increase in the mask aperture area results in an increase in the etching depth by 20-30 μm. Therefore, if the etching of the hole 9a through the large aperture 13b is stopped when the hole 9 penetrates through the substrate 1, the etching of the holes 11a through the respective small apertures 13a is stopped leaving a portion of the substrate 1 having a thickness of 20~30 μm (FIG. 13(b)). The etching time varies according to the thickness of the substrate. For example, when the thickness of the substrate is 100 μm, 150 μm, or 200 μm, the etching time is 100~120 minutes, 150~170 minutes, 200~220 minutes, respectively.

Since chlorine system dry etching is employed, side etching hardly occurs. Therefore, the holes 11a formed in the substrate 1 have a comb-shaped cross section as shown in FIG. 13(b).

Figure 13C:
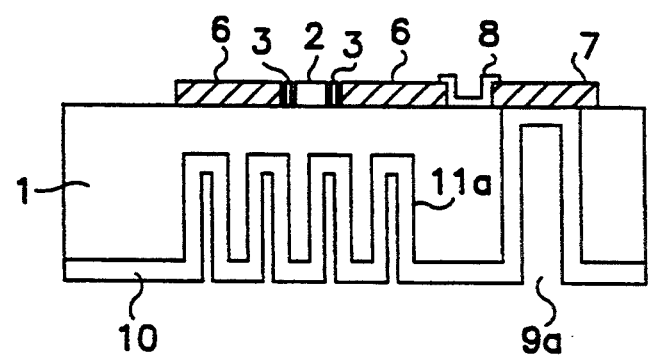

Thereafter, the grounding electrode 10 is formed on the rear surface of the substrate including the internal surfaces of the holes 11a and the via-hole 9a (FIG. 13(c)).

In the structure shown in FIG. 12, heat generated by the FETs on the front surface of the substrate 1 is rapidly conducted to the rear surface of the substrate, whereby output efficiency and reliability are improved. In addition, since there is a space between portions of the grounding electrode 10 in the hole 11a, thermal stress is relaxed, whereby warping of the IC chip is reduced.

Figure 15:
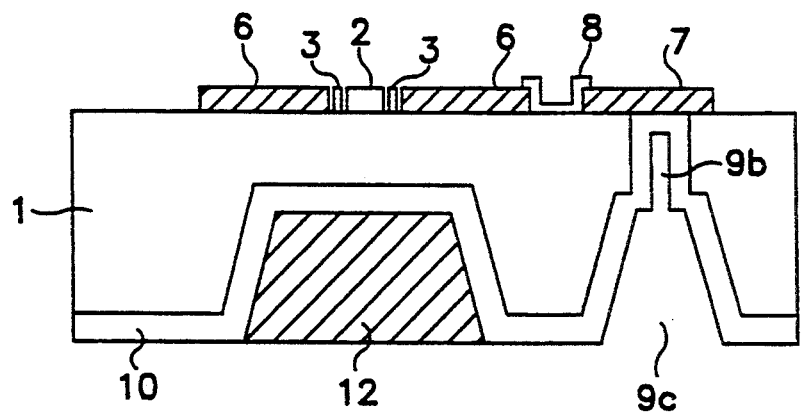
FIG. 15 is a sectional view illustrating a part of a high frequency MMIC in accordance with a seventh embodiment of the present invention.

FIG. 15 is a sectional view illustrating a part of a high frequency MMIC in accordance with a seventh embodiment of the present invention. FIGS. 16(a)-16(d) are sectional views illustrating process steps for fabricating the structure of FIG. 15. A via-hole of this seventh embodiment comprises a vertical upper part 9b and a tapered lower part 9c which are formed by wet etching while simultaneously etching the hole 11. Reference numeral 9d designates a hole formed by dry etching prior to the wet etching.

A description is given of the production process.

Figure 16A:
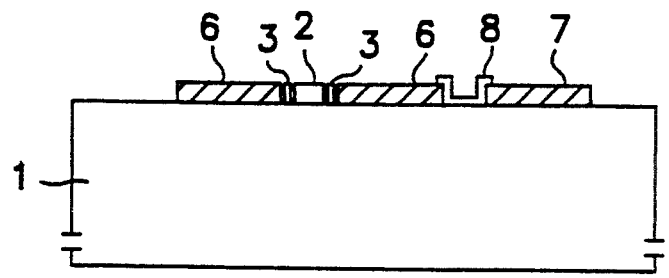
FIGS. 16(a)–16(d) are sectional views illustrating process steps in a method for producing the structure of FIG. 15.
Figure 16B:
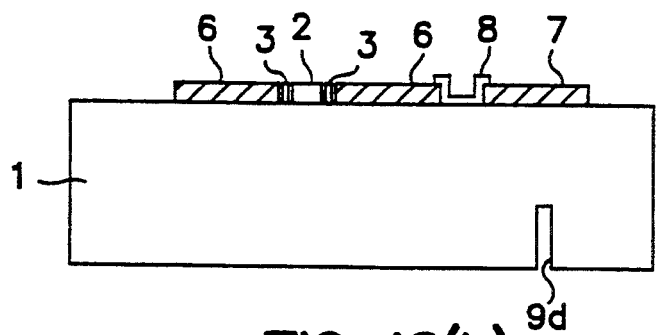
Figure 16C:
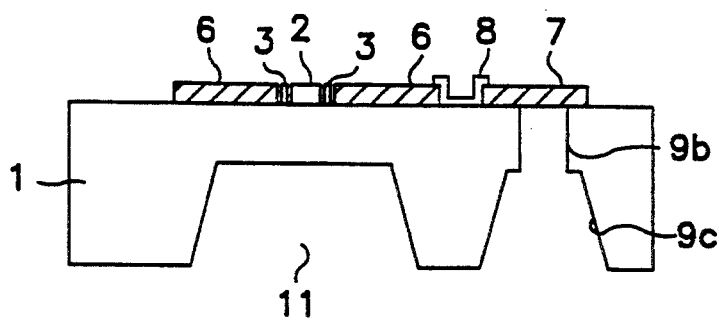

Initially, a GaAs substrate shown in FIG. 16(a) is dry etched from the rear surface using a positive resist film as an etching mask and SiCl$_4$/Cl$_2$ system gas as an etching gas, for thirty minutes, forming a hole 9d about 30 μm deep (FIG. 16(b)).

Thereafter, using, as an etching mask, a negative resist film having aperture patterns opposite the FET and the electrode 7, the substrate 1 is wet-etched from the rear surface. When the thickness of the substrate 1 is 100 μm, the wet etching is carried out to a depth of about 70 μm, whereby the upper and lower holes 9b and 9c, i.e., a via-hole penetrating through the substrate 1, is produced opposite the electrode 7 while a hole 11 about 70 μm deep is produced opposite the FET (FIG. 16(c)). When the thickness of the substrate is 150 μm or 200 μm, the etching depth is 120 μm or 170 μm, respectively.

Figure 16D:
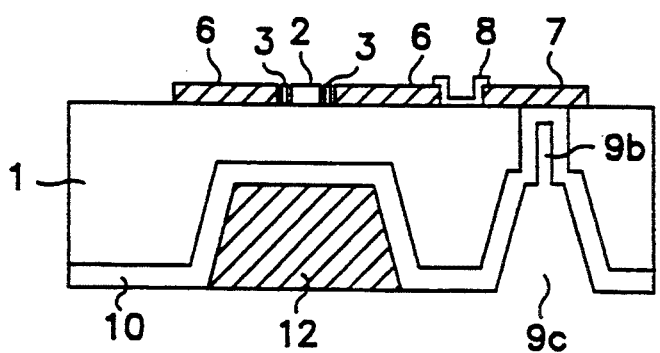

Thereafter, the hole 11 is filled with a plated Au layer 12 (FIG. 16(d)).

According to the seventh embodiment of the present invention, a part of the via-hole is formed in advance by dry etching and, thereafter, the upper and lower parts 9b and 9c of the via-hole are formed by wet etching simultaneously with the hole 11b. Therefore, the time required for the etching process is reduced. In addition, the thickness of the portion of the substrate 1 remaining above the hole 11 is easily controlled, whereby production precision is improved.

Figure 17:
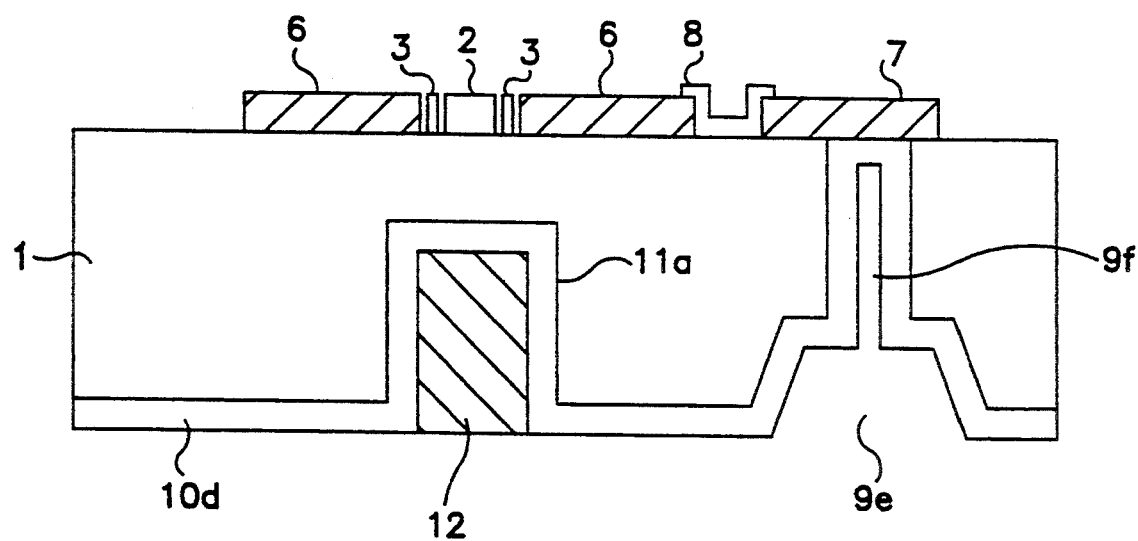
FIG. 17 is a sectional view illustrating a part of a high frequency MMIC in accordance with an eighth embodiment of the present invention.

FIG. 17 is a sectional view illustrating a part of a high frequency MMIC in accordance with an eighth embodiment of the present invention. In the figure, a vertical hole 11a is formed in the substrate 1 opposite the FET by dry etching. A via-hole of this eighth embodiment comprises a vertical upper part 9f formed by dry etching and a tapered lower part 9e formed by wet etching.

FIGS. 18(a)-18(d) illustrate process steps for fabricating the structure of FIG. 17.

Figure 18A:
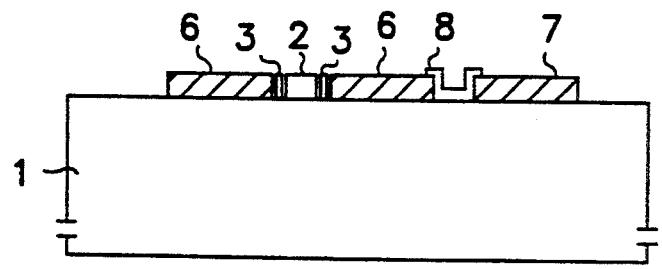
FIGS. 18(a)–18(d) are sectional views illustrating process steps in a method for producing the structure of FIG. 17.
Figure 18B:
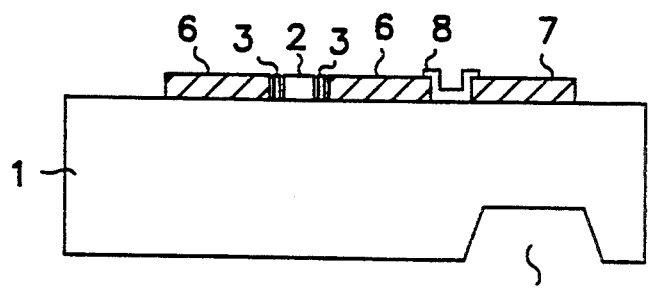

Initially, a GaAs substrate 1 shown in FIG. 18(a) is wet-etched from the rear surface using a negative resist film as an etching mask and H$_2$SO$_4$ system etchant, forming the lower hole 9e about 30 μm deep (FIG. 18(b)). The wet etching is carried out for about 5 minutes regardless of the thickness of the substrate 1.

Figure 18C:
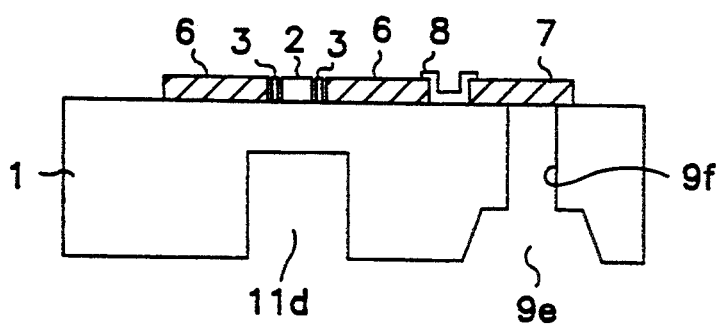

Thereafter, using a positive resist film having a first aperture opposite the FET and a second aperture in the via-hole lower part 9e as an etching mask, the substrate 1 is dry etched from the rear surface to a depth of about 70 μm, whereby the vertical hole 11d about 70 μm deep is formed opposite the FET while the via-hole upper part 9f is formed reaching the electrode 7 (FIG. 18(c)). The etching depths for substrates having thicknesses of 150 μm and 200 μm are 120 μm and 170 μm, respectively. In this dry etching process, the SiCl$_4$/Cl$_2$ system gas is employed.

Figure 18D:
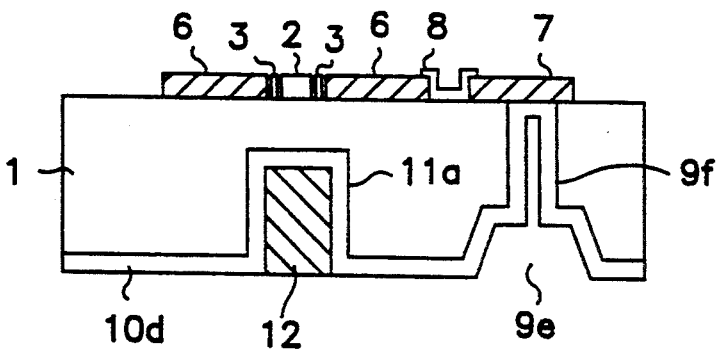

Thereafter, the hole 11 is filled with a plated Au layer 12 (FIG. 18(d)).

According to this eighth embodiment of the present invention, the via-hole lower part 9e is formed in advance by wet etching and, thereafter, the via-hole upper part 9f and the hole 11a are formed by dry etching. Therefore, the time required for the etching process is reduced. In addition, since the thickness of the part of the substrate 1 remaining above the hole 11 is precisely controlled, production precision is improved.

While in the above-described seventh embodiment the upper and lower parts 9b and 9c of the via-hole are formed from the rear surface of the substrate 1, the upper part 9b may be formed from the front surface of the substrate by dry etching before the formation of the electrode 7.

Furthermore, while in the above-described first to eighth embodiments a high frequency FET is described as the heat generating element, the present invention may be applied to other heat generating elements.

What is claimed is:

1. A semiconductor device comprising:
    a semiconductor substrate having opposed front and rear surfaces;
    a heat generating element disposed on the front surface of the substrate; and
    a cavity in the semiconductor including a chamber contained entirely within and surrounded by the semiconductor substrate and disposed opposite the heat generating element and an opening in the semiconductor substrate connecting the chamber to the front surface, the chamber having an area in a plane substantially parallel to the front and rear surfaces larger than an area of the opening in a plane substantially parallel to the front and rear surfaces.

2. The semiconductor device of claim 1 wherein the cavity has an internal surface and including a metal film disposed on the internal surface of the cavity.

3. The semiconductor device of claim 1 including a metal filling the cavity.

4. The semiconductor device of claim 1 wherein the cavity has an internal surface and including a film having a thermal conductivity higher than the semiconductor substrate disposed on the internal surface of the cavity.

5. The semiconductor device of claim 1 including a material having a thermal conductivity higher than the semiconductor substrate filling the cavity.

6. The semiconductor device of claim 1 wherein the cavity comprises two chambers contained entirely within the semiconductor substrate at opposite sides of the heat generating element and connected to each other directly opposite the heat generating element, each of the chambers including a respective opening connecting the chamber to the front surface, the respective opening being separated from each other by part of the substrate, the respective chambers having larger areas parallel to the front and rear surfaces than the openings.

7. The semiconductor device of claim 6 including a grounding electrode on the rear surface of the substrate, wherein said heat generating element is a field effect transistor having a source electrode, each of said chambers has a second opening extending to the rear surface of the substrate, and including a metal film in the openings and chambers and electrically connecting the source electrode of the field effect transistor to the grounding electrode.

8. The semiconductor device of claim 6 including a grounding electrode on the rear surface of the substrate, wherein said heat generating element is a field effect transistor having a source electrode, each of said chambers has a second opening extending to the rear surface of the substrate, and including a metal filling the openings and chambers and electrically connecting the source electrode of the field effect transistor to the grounding electrode.

9. A semiconductor device comprising:
   a semiconductor substrate having opposed front and rear surfaces;
   a heat generating element disposed on the front surface of the substrate;
   a first electrode disposed on part of the front surface of the substrate;
   a via-hole penetrating through the substrate and in contact with the first electrode;
   a plurality of recesses in the substrate at the rear surface of the substrate, each of the recesses being disposed opposite and spaced from the heat generating element by part of the substrate; and
   a second electrode disposed on the rear surface of the substrate including in the via-hole and in the recesses, the second electrode contacting the first electrode through the via-hole.

* * * * *